(12) United States Patent
Singleton et al.

(10) Patent No.: US 9,001,472 B2
(45) Date of Patent: Apr. 7, 2015

(54) SHIELD STABILIZATION CONFIGURATION WITH APPLIED BIAS

(71) Applicant: Seagate Technology LLC, Cupertino, CA (US)

(72) Inventors: Eric Walter Singleton, Maple Plain, MN (US); Junjie Quan, Bloomington, MN (US); Jae-Young Yi, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/109,184

(22) Filed: Dec. 17, 2013

(65) Prior Publication Data

US 2014/0104729 A1    Apr. 17, 2014

Related U.S. Application Data

(63) Continuation of application No. 13/167,142, filed on Jun. 23, 2011, now abandoned.

(51) Int. Cl.
| | |
|---|---|
| G11B 5/11 | (2006.01) |
| G11B 5/39 | (2006.01) |
| H01L 43/08 | (2006.01) |
| H01L 43/12 | (2006.01) |
| C22F 1/00 | (2006.01) |
| G01R 33/09 | (2006.01) |

(52) U.S. Cl.
CPC ............... *G11B 5/11* (2013.01); *G11B 5/3912* (2013.01); *G11B 5/398* (2013.01); *H01L 43/08* (2013.01); *H01L 43/12* (2013.01); *C22F 1/00* (2013.01); *G01R 33/093* (2013.01)

(58) Field of Classification Search
CPC ...................................................... G11B 5/3912
USPC .......................................................... 360/319
See application file for complete search history.

(56) References Cited

U.S. PATENT DOCUMENTS

| | | |
|---|---|---|
| 6,597,545 B2 | 7/2003 | Macken et al. |
| 6,710,982 B2 | 3/2004 | Mack et al. |
| 6,930,865 B2 | 8/2005 | Ghaly et al. |
| 7,615,996 B1 | 11/2009 | Machita et al. |
| 7,782,574 B1 | 8/2010 | Benakli et al. |
| 2003/0189802 A1 | 10/2003 | Morinaga et al. |
| 2004/0100737 A1 | 5/2004 | Nakamoto et al. |
| 2005/0088789 A1 | 4/2005 | Hou et al. |
| 2005/0157431 A1 | 7/2005 | Hatatani et al. |
| 2007/0195467 A1 | 8/2007 | Gill |
| 2009/0135529 A1 | 5/2009 | Shimazawa et al. |
| 2009/0174968 A1 | 7/2009 | Singleton et al. |
| 2009/0190272 A1 | 7/2009 | Machita et al. |
| 2009/0279213 A1 | 11/2009 | Wu et al. |

(Continued)

FOREIGN PATENT DOCUMENTS

| | | |
|---|---|---|
| JP | 2004-334921 A | 11/2004 |
| JP | 2006-309842 A | 11/2006 |
| JP | 2010-086648 A | 4/2010 |

*Primary Examiner* — Craig A. Renner
(74) *Attorney, Agent, or Firm* — Hall Estill Attorneys at Law (57) ABSTRACT

An apparatus includes a sensor stack, first and second shields positioned on opposite sides of the sensor stack, and a first shield stabilization structure adjacent to the first shield and applying a bias magnetic field to the first shield. A second shield stabilization structure can be positioned adjacent to the second shield.

20 Claims, 8 Drawing Sheets

(56) References Cited

U.S. PATENT DOCUMENTS

| | | |
|---|---|---|
| 2010/0027168 A1* | 2/2010 | Chou et al. .................. 360/319 |
| 2010/0039734 A1 | 2/2010 | Hara et al. |
| 2010/0067148 A1 | 3/2010 | Tsuchiya et al. |
| 2010/0079917 A1 | 4/2010 | Miyauchi et al. |
| 2010/0103562 A1 | 4/2010 | Machita et al. |
| 2010/0188775 A1 | 7/2010 | Macken et al. |
| 2010/0214698 A1 | 8/2010 | Macken et al. |
| 2011/0051291 A1 | 3/2011 | Miyauchi et al. |
| 2011/0069417 A1 | 3/2011 | Kawamori et al. |
| 2011/0091744 A1* | 4/2011 | Kawamori et al. .......... 428/810 |
| 2011/0279923 A1 | 11/2011 | Miyauchi et al. |
| 2012/0087045 A1 | 4/2012 | Yanagisawa et al. |
| 2012/0087046 A1 | 4/2012 | Yanagisawa et al. |
| 2012/0147504 A1 | 6/2012 | Zhou et al. |
| 2012/0250189 A1 | 10/2012 | Degawa et al. |

* cited by examiner

SHIELD STABILIZATION CONFIGURATION WITH APPLIED BIAS

RELATED APPLICATION

This application is a continuation of copending U.S. patent application Ser. No. 13/167,142 filed on Jun. 23, 2011.

BACKGROUND

As the storage capacity of magnetic data storage devices increases, the magnetic bit size in the storage media becomes smaller. A smaller bit size requires a reduction in physical dimensions of the recording head.

Magnetic recording heads typically include a reader portion having a sensor for retrieving magnetically encoded information stored on a magnetic disc. Magnetic flux from the surface of the disc causes rotation of the magnetization vector of a sensing layer or layers of the sensor, which in turn causes a change in the electrical properties of the sensor. The sensing layers are often called free layers, since the magnetization vectors of the sensing layers are free to rotate in response to external magnetic flux. The change in the electrical properties of the sensor may be detected by passing a current through the sensor and measuring a voltage across the sensor. Depending on the geometry of the device, the sense current may be passed in the plane (CIP) of the layers of the device or perpendicular to the plane (CPP) of the layers of the device. External circuitry then converts the voltage information into an appropriate format and manipulates that information as necessary to recover information encoded on the disc.

The magnetoresistive (MR) sensor (reader) may be located between high permeability shields to screen the sensor from external magnetic fields, such as stray fields from media. With increasing recording density, the shield-to-shield spacing of the reader becomes narrower to meet higher linear density requirements and to screen external flux.

A narrow shield-to-shield spacing of the reader requires that layers in the reader stack become thinner, which makes the sensor more sensitive to materials around it. A thinner reader stack cap could make the free layer more susceptible to magnetic domain changes in the shields and introduce unwanted instability. Furthermore, the shield topography may also introduce additional domain movement in the shield, which could influence the free layer response and add noise to the read signal.

In order to ensure the stability of the reader when it is subjected to external fields and to minimize noise from any magnetic domain movement inside the shields, it would be desirable to provide improved control of the magnetic properties of the shields.

SUMMARY

In a first aspect, the disclosure provides apparatus including a sensor stack, first and second shields positioned on opposite sides of the sensor stack, and a first shield stabilization structure adjacent to the first shield and applying a bias magnetic field to the first shield.

These and other features and advantages which characterize the various embodiments of the present disclosure can be understood in view of the following detailed description and the accompanying drawings.

DETAILED DESCRIPTION

In one aspect, this disclosure provides an apparatus including a read sensor between magnetic shields, wherein the shields are stabilized with an applied magnetic bias. This configuration can reduce magnetic disturbances on read sensor stack.

Figure 1:
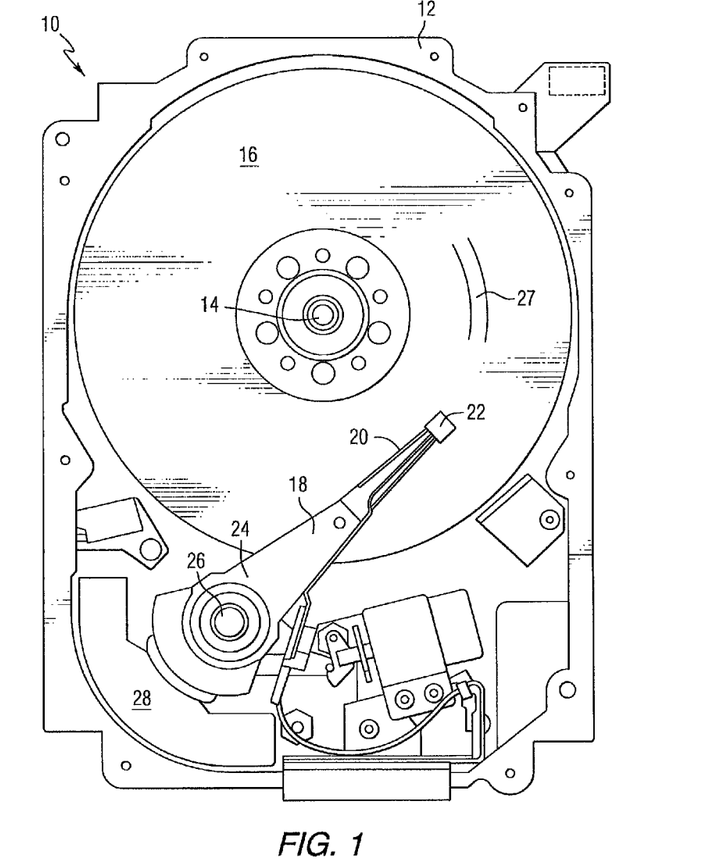
FIG. 1 is a pictorial representation of a data storage device in the form of a disc drive that can include a recording head having a reader constructed in accordance with an aspect of this disclosure.

FIG. 1 is a pictorial representation of a data storage device in the form of a disc drive 10 that can utilize recording heads having a reader constructed in accordance with the disclosure. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector or track 27 of the disc 16. The actuator motor 28 is regulated by a controller, which is not shown in this view and is well-known in the art.

Figure 2:
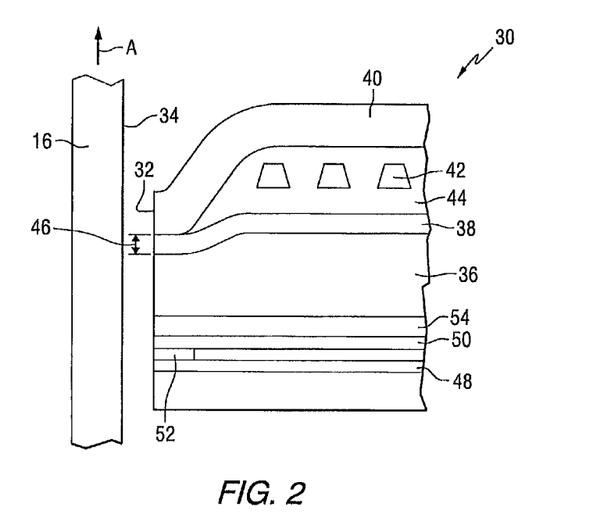
FIG. 2 is a schematic side elevation view of a portion of a recording head constructed in accordance with an aspect of the disclosure.

FIG. 2 is a cross-sectional view of magnetic read/write head 30 and magnetic disc 16 taken along a plane normal to air bearing surface 32 of read/write head 30. FIG. 2 illustrates a magnetic read/write head 30 and its placement relative to magnetic disc 16. The air bearing surface ABS of magnetic read/write head 30 faces the disc surface 34 of magnetic disc 16. Magnetic disc 16 travels or rotates in a direction relative to magnetic read/write head as indicated by arrow A. The spacing between air bearing surface 32 and disc surface 34 is preferably minimized while avoiding contact between magnetic read head and magnetic disc. Contact between magnetic read head and magnetic disc can potentially destroy both magnetic read head and magnetic disc.

A writer portion of magnetic read/write head includes first pole 36, write gap layer 38, second pole 40, conductive coil 42, and insulator layer 44. Write gap 46 is defined on air bearing surface ABS by write gap layer 38 between terminating ends of the poles. Electrically conductive coil 42 is provided to generate magnetic fields across the write gap 46 and is positioned in insulator layer 44 between first pole and the write gap layer. While FIG. 2 shows a single layer coil, it should be understood that several layers of conductive coils, separated by insulating layers, may be used.

A reader portion of read/write head 30 includes a first shield 48, a second shield 50, and read element 52 positioned between terminating ends of the shields 48 and 50. The reader can be separated from the writer by an insulating layer 54. Alternatively, shield 36 could serve as the top shield of the reader assembly.

The reader shields may be constructed of high permeability materials that function to protect the sensor element from stray magnetic fields originating from adjacent magnetic bits on the medium. With decreasing sensor size, the shield-to-shield spacing of the MR sensor should be made smaller to adequately screen the flux from adjacent bits.

Contemporary read heads typically include a thin film multilayer structure containing ferromagnetic material that exhibits some type of magnetoresistance (MR). A typical MR sensor configuration includes a multilayered structure formed of a nonmagnetic layer positioned between a synthetic antiferromagnet (SAF) and a ferromagnetic free layer, or between two ferromagnetic free layers. The resistance of the MR sensor depends on the relative orientations of the magnetization of the magnetic layers. The read sensing element can be a layered stack having, for example, a CIP or CPP configuration.

Figure 3:
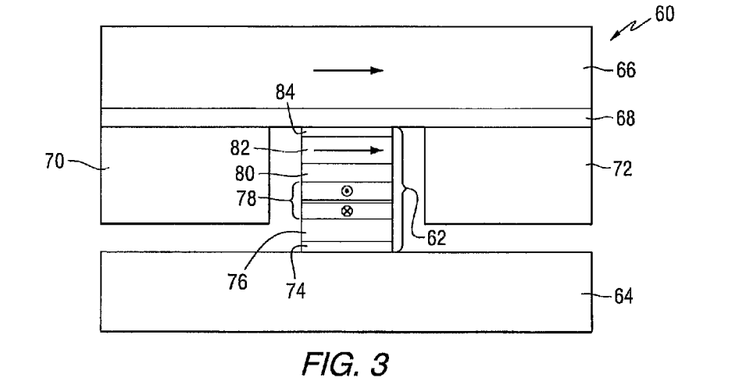
FIG. 3 is a schematic diagram of tunneling magneto-resistance sensor assembly.

FIG. 3 is a schematic diagram of tunneling magneto-resistance sensor assembly 60. A reader sensor 62 is positioned between a first or bottom shield 64 and a second or top shield 66. A non-magnetic cap layer 68 separated the sensor from the top shield. Magnetic layers or permanent magnets 70 and 72 are positioned on opposite sides of the reader sensor. The reader sensor includes a layered stack including a seed layer 74, an antiferromagnetic layer 76, a synthetic antiferromagnetic structure 78, a barrier layer 80, a free layer 82, and a capping layer 84.

For known recording heads, the reader shields have a thickness that ranges from about 0.2 µm to about 2 µm. Non-magnetic reader stack seed and cap layers separate the shields from reader stack to minimize the magnetic coupling effect. Normally, the magnetic direction of the shields is set to be parallel to the air bearing surface (ABS) of the recording head without any external magnetic field. When an external magnetic field (such as a stray field) is introduced, the magnetic direction of the shields responds to the external field and rotates to protect the reader sensor from disturbance. If the shields near the reader stack area cannot return to the original magnetic state when the external field is removed, uncertainty will be added to the reader response and noise will be added to the reader signal. Furthermore, different annealing temperatures and directions in the recording head build process may also add uncertainty to the magnetic properties of the shields when responding to an external field. Therefore, it is desirable that the shields, or at least a portion of the shields near reader sensor, return to the same magnetic state after any external magnetic disturbance.

Figure 4:
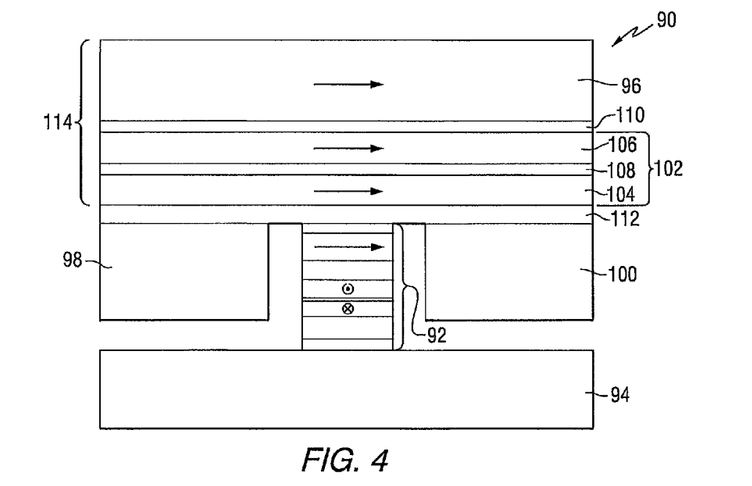
FIG. 4 is a schematic diagram of a sensor assembly including an antiferromagnetic (AFM) bias configuration.

In one aspect of the disclosure, to stabilize the shield and reduce unwanted instability, an anti-ferromagnetic (AFM) bias structure is employed to minimize uncertainty of the direction of magnetization in the shield. FIG. 4 is a schematic diagram illustrating a sensor assembly 90 constructed in accordance with this aspect of the disclosure. The sensor assembly includes a reader sensor 92 positioned between a first or bottom shield 94 and a second or top shield 96. In one embodiment, the reader sensor 92 can include the same arrangement of layers shown in the reader sensor 62 of FIG. 3. However, this disclosure is not limited to any particular reader sensor stack configuration. First and second magnetic layers or permanent magnets 98 and 100 are positioned on opposite sides of the reader sensor. A shield stabilization structure including an AFM stack 102 is positioned between reader sensor 92 and top shield 96. The AFM stack includes a first layer 104 of a magnetic material, which can be a material with high permeability, for example NiFe, or high magnetic moment, for example CoFeX, such as CoFe, CoFeB, CoFeZr and CoFeRh, or a multilayer structure, for example, CoFeX/NiFe, and an AFM layer 106 that provides a bias to the adjacent magnetic layer 104. The AFM layer can be, for example, IrMn, PtMn, FeMn and NiO.

The thickness of the first layer 104 can range from about 10 nm to about 100 nm and thickness of the AFM layer 106 can range from about 5 nm to about 15 nm depending on desired bias strength. For some materials in layer 104 (such as NiFeX, for example, but not limited to, NiFe, NiFeNb, NiFeTa, NiFeRh or NiFeW), a thin magnetic layer 108 (such as CoFe) can be added to improve the AFM bias. A non-magnetic layer 110, having a thickness of, for example, several nanometers, can be included on top of AFM layer to eliminate exchange coupling between shield 96 and AFM layer. Another non-magnetic layer 112 is included between layer 104 and PM/reader to reduce exchange coupling between permanent magnets and layer 104. The combination of shield 96, AFM stack 102 and non-magnetic layer 110 forms a composite shield 114.

Figure 5:
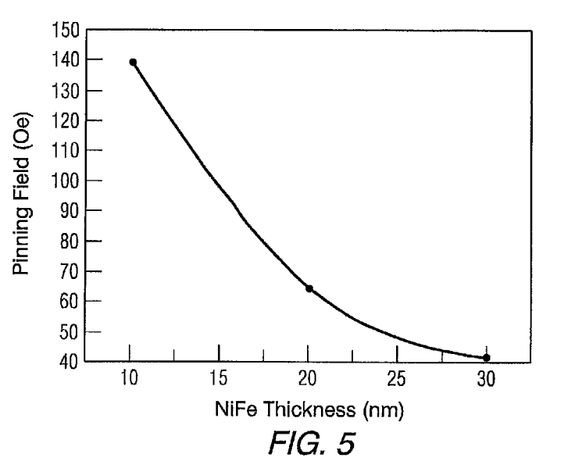
FIG. 5 is a graph of magnetic pinning field versus magnetic layer thickness.
Figure 6:
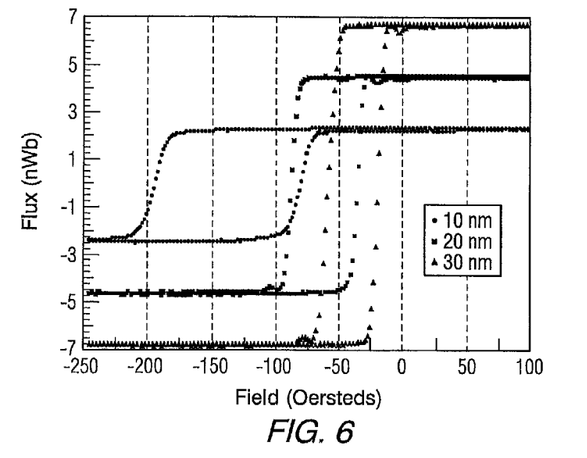
FIG. 6 is a graph of magnetic flux versus magnetic field.

FIGS. 5 and 6 show magnetic hysteresis loop (i.e., magnetic flux versus field) measurements of the AFM strength as a function of thickness of layer 104. A reader sensor configuration having an AFM stack similar to the stack 104 in FIG. 4 was used to determine the bias strength. For an AFM stack configuration of seed/NiFe (10-30 nm)/CoFe (1.5 nm)/IrMn (9 nm)/cap, the data in FIGS. 5 and 6 shows that the AFM bias decreases and the NiFe coercivity increases with an increase in NiFe thickness.

Using a low temperature anneal (e.g., lower than the reader stack anneal) after shield stabilization layers are formed, the magnetization of the AFM layer can be set to a desired direction as long as the annealing temperature is higher than the AFM blocking temperature. Thus in one aspect, this disclosure provides method including: providing a sensor structure including a sensor stack, first and second shields positioned on opposite sides of the sensor stack, and a first shield stabilization structure adjacent to the first shield and applying a bias magnetic field to the first shield; and annealing the structure at a first temperature lower than an anneal temperature of the sensor stack, to set a direction of magnetization of the first shield stabilization structure. When the first shield stabilization structure includes a first antiferromagnetic layer adjacent to a first magnetic layer, and the first temperature is higher than an antiferromagnetic blocking temperature of the first antiferromagnetic layer.

In the assembly of FIG. 4 for example, the direction of magnetization of the AFM layer 106 is set from left to right, and the AFM bias also gives magnetic layer 104 a stable magnetic direction. Because of the bias effect from the AFM layer, magnetic direction of layer 104 always returns to its original state whenever the external magnetic field is removed. This improves the magnetic stability of the shield 114.

The magnetic flux from the AFM bias configuration of FIG. 4 may apply an unwanted torque to magnetic layers in sensor stack, which may cause instability and introduce undesirable noise. To minimize any source of instability, an AFM bias with a synthetic antiferromagnetic (SAF) structure can be used as shown in FIG. 7.

Figure 7:
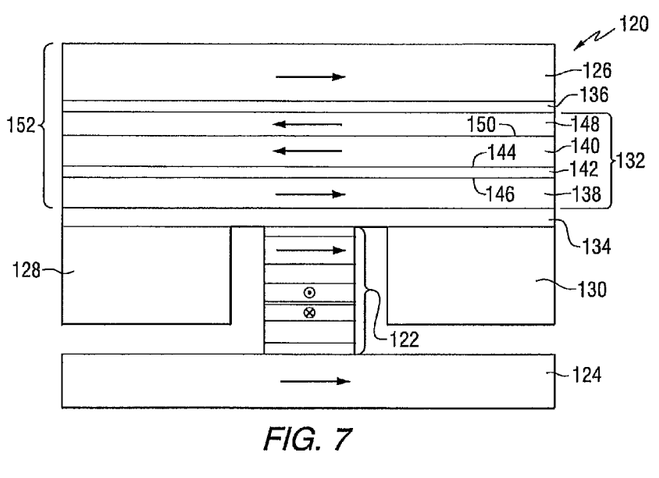
FIG. 7 is a schematic diagram of a sensor assembly including an AFM plus a synthetic antiferromagnetic (SAF) configuration.

FIG. 7 is a schematic diagram illustrating a sensor assembly 120 that includes an AFM and SAF biasing structure in the top shield. The sensor assembly includes a reader sensor 122 positioned between a first or bottom shield 124 and a second or top shield 126. The reader sensor can include the same arrangement of layers shown in the reader sensor of FIG. 3. However, this disclosure is not limited to any particular reader sensor stack configuration. First and second magnetic layers or permanent magnets 128 and 130 are positioned on opposite sides of the reader sensor.

An AFM shield stabilization structure 132 is positioned between the sensor stack and the top shield. Similar to AFM bias structure of FIG. 4, a non-magnetic layer 134 is included to magnetically separate shield and reader sensor (and PM) from shield stabilization structure. Another non-magnetic layer 136 is included to magnetically separate the shield 126 and the shield stabilization structure 132. Layers 138 and 140 are magnetic materials (such, as for example, NiFeX/CoFe or CoFeX alloy) and are separated by non-magnetic spacer layer 142 (such as, for example, Ru) to introduce SAF coupling. Thin magnetic layers 144 and 146 (such as CoFe) can be inserted at both sides of spacer layer 142 to increase SAF coupling for some materials (such as NiFe) in layers 138 and 140. An AFM layer 148 is positioned adjacent to layer 140. A thin magnetic layer 150 (such as CoFe) may be needed to get sufficient AFM bias if layer 140 is a NiFe based alloy. The thickness of both layers 138 and 140 can be optimized to get a balanced antiparallel magnetic moment between layers 138 and 140, as indicated by the arrows in layers 138 and 140. A balanced SAF structure results in closed flux between layers 138 and 140 and does not give any undesirable torque to the layers of the reader sensor. The combination of shield 126, AFM shield stabilization structure 132 and non-magnetic layer 136 forms a composite shield 152.

The annealing direction of magnetization of structure 132 can be adjusted to get a desired magnetic direction in the SAF structure. As indicated in FIG. 7, the direction of magnetization on the AFM layer is set from right to left and gives layer 140 a magnetic direction from right to left. With the SAF coupling between layers 138 and 140, the direction of magnetization of layer 138 will be aligned from left to right, which ensures the same magnetic orientation with the PM bias direction. Strong SAF coupling between layers 138 and 140, coupled with the bias field from AFM layer 148, ensures that the whole structure 132 will return back to original state as shown in FIG. 7 when an external magnetic field is removed. This ensures that the shields near the reader sensor always have the same magnetic state whenever a new bit comes to the vicinity of the reader, and reduces uncertainty that may result from shield instability.

Figure 8:
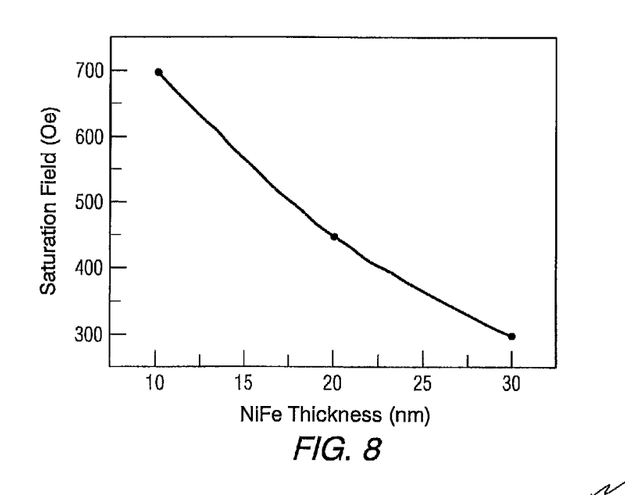
FIG. 8 is a graph of saturation field versus magnetic layer thickness.

FIG. 8 shows magnetic hysteresis loop (i.e., magnetic flux versus field) measurement of the SAF coupling as a function of magnetic layer thickness. A sensor configuration of seed/ NiFe (10-30 nm)/CoFe (1 nm)/Ru (0.8 nm)/CoFe (1 nm)/ NiFe (10-30 nm)/cap was used to measure the SAF coupling field. FIG. 8 shows that the coupling field decreases with an increase of NiFe thickness and the magnetic layer thickness can be adjusted to achieve the desired SAF coupling.

In the embodiments described above, the shield stabilization structure is located between the reader sensor/PM stack and the top shield. Smooth interfacial structures, which are desirable to obtain a high coupling field, can be obtained if the reader sensor and the PM have smooth top surfaces.

In another embodiment, AFM bias with or without a SAF configuration can be included in both shields. Shield stabilization with an AFM bias and with or without SAF configurations can also be applied between the reader sensor and bottom shield to improve the stabilization of the pinned layer and the reference layer.

Figure 9:
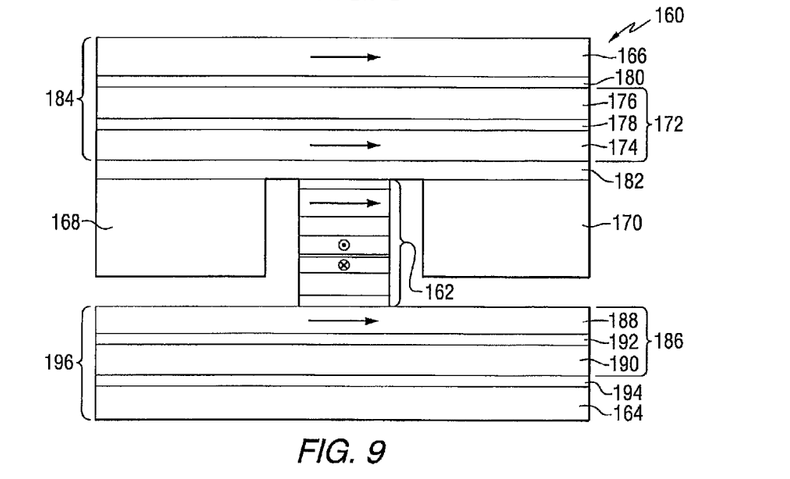
FIG. 9 is a schematic diagram of an AFM bias configuration in both shields.

FIG. 9 is a schematic diagram of a sensor assembly 160 with an AFM bias structure in both the bottom and top shields. The sensor assembly include a reader sensor 162 positioned between a first or bottom shield 164 and a second or top shield 166. In one embodiment, the reader sensor 162 can include the same arrangement of layers shown in the reader sensor of FIG. 3. However, this disclosure is not limited to any particular reader sensor stack configuration. First and second magnetic layers or permanent magnets 168 and 170 are positioned on opposite sides of the reader sensor. An AFM stack 172 is positioned between reader sensor 162 and top shield 166. The AFM stack includes a first layer 174 of a magnetic material, which can be a material with high permeability, for example, NiFe, a high magnetic moment, for example, CoFeX, or a multilayer structure, for example, CoFeX/NiFe, and an AFM layer 176 that provides a bias to the adjacent magnetic layer 174. The thickness of the first layer 174 can range from about 10 nm to about 100 nm and the thickness of the AFM layer can range from about 5 nm to about 15 nm depending on desired bias strength. For some materials in layer 174 (such as NiFeX), a thin magnetic layer 178 (such as CoFe) can be added to improve the AFM bias. A non-magnetic layer 180, having a thickness of, for example, several nanometers, is included on top of AFM layer to eliminate exchange coupling between shield 166 and AFM layer. Another non-magnetic layer 182 is included between layer 174 and PM/reader to reduce exchange coupling between permanent magnets and layer 174. The combination of shield 166, AFM stack 172 and non-magnetic layer 180 forms a composite shield 184.

Another AFM stack 186 is positioned between reader sensor 162 and bottom shield 164. The AFM stack includes a first layer 188 of a magnetic material, which can be a material with high permeability, for example, NiFe, high magnetic moment, for example, CoFeX, or a multilayer structure, for example, CoFeX/NiFe, and an AFM layer 190 that provides a bias to the adjacent magnetic layer 188. The thickness of the first layer 188 can range from about 10 nm to about 100 nm and thickness of the AFM layer can range from about 5 nm to about 15 nm depending on desired bias strength. For some materials in layer 188 (such as NiFeX), a thin magnetic layer 192 (such as CoFe) can be added to improve the AFM bias. A non-magnetic layer 194, having a thickness of for example several nanometers, is included below AFM layer to eliminate exchange coupling between shield 164 and AFM layer. The combination of shield 164, AFM stack 186 and non-magnetic layer 194 forms a composite shield 196.

Figure 10:
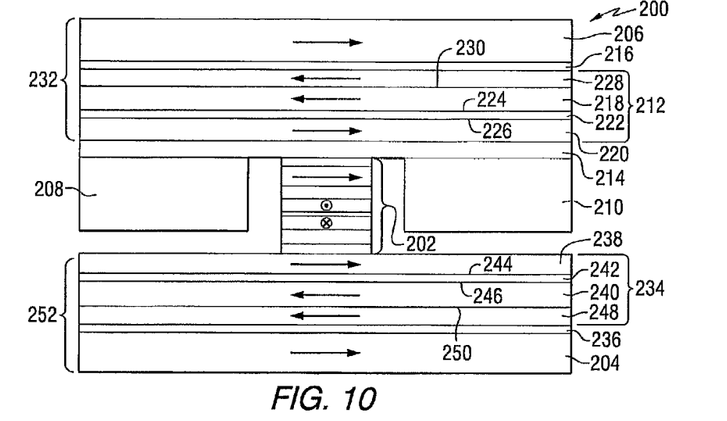
FIG. 10 is a schematic diagram of an AFM plus SAF configuration in both shields.

FIG. 10 is a schematic diagram illustrating a sensor assembly 200 constructed in accordance with another aspect of the disclosure. The sensor assembly includes a reader sensor 202 positioned between a first or bottom shield 204 and a second or top shield 206. The reader sensor can include the same arrangement of layers shown in the reader sensor of FIG. 3. However, this disclosure is not limited to any particular reader sensor stack configuration. First and second magnetic layers or permanent magnets 208 and 210 are positioned on opposite sides of the reader sensor.

An AFM shield stabilization structure 212 is positioned between the sensor stack and the top shield. Similar to AFM bias structure of FIG. 4, non-magnetic layer 214 is included to magnetically separate shield and reader sensor (and PM) from shield stabilization structure. Non-magnetic layer 216 is included to magnetically separate the shield 206 and the shield stabilization structure 212. Layers 218 and 220 are magnetic materials (such as, for example, NiFeX or CoFeX alloy) and are separated by non-magnetic spacer layer 222 (such as for example Ru) to introduce SAF coupling. Thin magnetic layers 224 and 226 (such as CoFe) can be inserted at both sides of spacer layer 222 to increase SAF coupling for some materials (such as NiFe) in layers 218 and 220. An AFM layer 228 is positioned adjacent to layer 218. A thin magnetic layer 230 (such as CoFe) may be needed to get sufficient AFM bias if layer 218 is a NiFe based alloy. The thickness of both layers 218 and 220 can be optimized to get a balanced magnetic moment between layers 218 and 220. A balanced SAF structure results in closed flux between layers 218 and 220 and does not give any undesirable torque to the other layers of the reader sensor. The combination of shield 206, AFM shield stabilization structure 212 and non-magnetic layer 216 forms a composite shield 232.

Another AFM shield stabilization structure 234 is positioned between the sensor stack and the bottom shield. Non-magnetic layer 236 is included to magnetically separate the shield 204 and the shield stabilization structure 234. Layers 238 and 240 are magnetic materials (such as, for example, NiFeX or CoFeX alloy) and are separated by non-magnetic spacer layer 242 (such as, for example, Ru) to introduce SAF coupling. Thin magnetic layers 244 and 246 (such as CoFe) can be inserted at both sides of spacer layer 242 to increase SAF coupling for some materials (such as NiFe) in layers 238 and 240. An AFM layer 248 is positioned adjacent to layer 240. A thin magnetic layer 250 (such as CoFe) may be needed to get sufficient AFM bias if layer 240 is a NiFe based alloy. The thickness of both layers 238 and 240 can be optimized to get balanced antiparallel magnetic moments between layers 238 and 240, as illustrated by the arrows in layers 238 and 240. A balanced SAF structure results in closed flux between layers 238 and 240 and does not give any undesirable torque to the other layers of the reader sensor. The combination of shield 204, AFM shield stabilization structure 234 and non-magnetic layer 236 forms a composite shield 252.

The annealing direction of magnetization of structure 212 can be adjusted to get a desired magnetic direction in the SAF structure. As indicated in FIG. 10, the direction of magnetization on the AFM layer is set from right to left and gives layer 218 a magnetic direction from right to left. With the SAF coupling between layers 218 and 220, the direction of magnetization of layer 220 will be aligned from left to right, which ensures the same magnetic orientation with the PM bias direction. Strong SAF coupling between layers 218 and 220, coupled with the bias field from AFM layer 228, ensures that the whole structure 212 will return back to original state as shown in FIG. 10 when an external magnetic field is removed. This ensures that the shields near the reader sensor always have the same magnetic state whenever a new bit comes to the vicinity of the reader, and reduces uncertainty that may result from shield instability.

In the embodiments of both FIGS. 9 and 10, the magnetic layer and AFM thicknesses in bottom shield can be chosen to have AFM setting at a lower temperature than reader stack annealing temperature. As long as the AFM setting temperature is chosen between the AFM blocking temperature of the shield stabilization configuration (for both AFM structures in bottom and top shields) and the AFM block temperature in the reader sensor stack, the magnetization direction of the AFM configuration in both shields can be aligned to desired direction, for example, parallel to the ABS as shown in FIGS. 9 and 10. Thus where the sensor structure includes a first shield stabilization structure including a first antiferromagnetic layer adjacent to a first magnetic layer, and a second shield stabilization structure adjacent to the second shield and applying a bias magnetic field to the second shield, the directions of magnetization of the first and second shield stabilization structures can be set by annealing at a temperature that is higher than an antiferromagnetic blocking temperature of the first and second antiferromagnetic layers, but lower than the reader stack annealing temperature.

FIGS. 9 and 10 show diagrams of simple AFM bias configurations in both shields (FIG. 9) and AFM with SAF configuration (FIG. 10). The magnetic direction of the shield layers adjacent to reader stack/PM is always aligned with the PM bias direction to eliminate any disturbance from magnetic moment mismatch.

The magnetic moment in the SAF structure inside the reader sensor is not allowed to rotate under magnetic fields coming from the magnetic media. Therefore, a disturbance from an unstable top shield may have a bigger effect on the reader sensor instability than a disturbance from the bottom shield, as the top shield is much closer to the free layer in reader stack.

There might be a concern that adding thick non-magnetic layers, such as the AFM layer, between the reader sensor and the shields may affect the reader shield-to-shield spacing. By selecting an optimized thickness of the magnetic layer adjacent to the reader sensor in the AFM with or without SAF configurations, the shield-to-shield spacing of the reader sensor will not be affected by the non-magnetic layers.

The shield area adjacent to reader sensor has the most sensitive effect on screening an external field from reader signal. Therefore, stabilizing the shield area right above or below reader sensor area has a direct impact on minimizing the shield influence and reducing noise from shields. Furthermore, depositing layers with good AFM biasing and SAF coupling for the whole shield area uniformly is challenging due to the topography of shield, defect formation and limitations in the deposition process.

Figure 11:
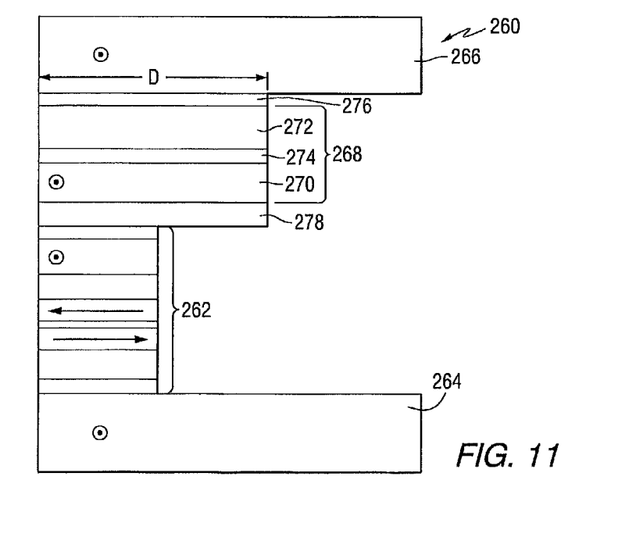
FIG. 11 is a schematic cross-section view of a shield stabilization configuration having a different aspect ratio.

In one embodiment, the size of shield stabilization configuration can be reduced to cover areas close to reader sensor. FIG. 11 is a schematic diagram illustrating a sensor assembly 260 constructed in accordance with this aspect of the disclosure. The sensor assembly includes a reader sensor 262 positioned between a first or bottom shield 264 and a second or top shield 266. In one embodiment, the reader sensor 262 can include the same arrangement of layers shown in the reader sensor of FIG. 3. However, this disclosure is not limited to any particular reader sensor stack configuration. First and second magnetic layers or permanent magnets (not shown in this view) are positioned on opposite sides of the reader sensor. An AFM stack 268 is positioned between reader sensor 262 and top shield 266. The AFM stack includes a first layer 270 of a magnetic material, which can be a material with high permeability, for example, NiFe, a high magnetic moment, for example, CoFeX, or multilayer structure, for example, CoFeX/NiFe, and an AFM layer 272 that provides a bias to the adjacent magnetic layer 270. The thickness of the first layer 270 can range from about 10 nm to about 100 nm and the thickness of the AFM layer can range from about 5 nm to about 15 nm depending on desired bias strength. For some materials in layer 270 (such as NiFeX or CoFeX), a thin magnetic layer 274 (such as CoFe) can be added to improve the AFM bias. A non-magnetic layer 276, having a thickness of, for example, several nanometers, is included on top of AFM layer to eliminate exchange coupling between shield 266 and AFM layer. Another non-magnetic layer 278 is included between layer 270 and PM/reader to reduce exchange coupling between permanent magnets and layer 270.

Different shapes and aspect ratios can also be applied to the shield stabilization configurations to improve shield stability.

Figure 12:
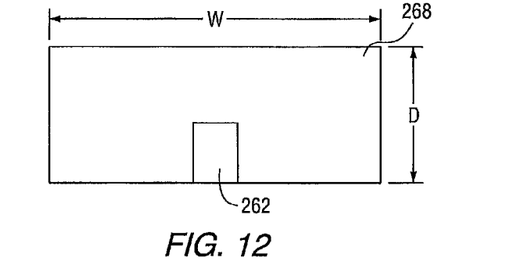
FIG. 12 is a schematic top-down view of the shield stabilization configuration of FIG. 11.

FIGS. 11 and 12 show schematic diagrams of an example of a reduced area of the AFM bias configuration. FIG. 11 is a cross section view of reader sensor into ABS direction and FIG. 12 is a top-down view of reader sensor area. Depth D and width W of AFM biased structure (i.e., the aspect ratio) can be adjusted to get the most magnetically stable configuration. Generally, W/D>1 is required to get shape anisotropy and W/D>>1 is preferred. In another embodiment, the width and depth of the stabilization structure are greater than or equal to the width and depth of the sensor stack.

In another aspect, the disclosure provides an apparatus including a data storage medium, a recording head including a sensor stack, first and second shields positioned on opposite sides of the sensor stack, and a first shield stabilization structure adjacent to the first shield and applying a bias magnetic field to the first shield, and an arm for positioning the recording head adjacent to the data storage medium. The first shield stabilization structure can include a first antiferromagnetic layer adjacent to a first magnetic layer. The apparatus can further include a second magnetic layer separated from the first magnetic layer by a first non-magnetic layer to form a first synthetic antiferromagnetic structure. The magnetic moment between the first and second magnetic layers can be balanced. The apparatus can further include a second shield stabilization structure adjacent to the second shield and applying a bias magnetic field to the second shield. The second shield stabilization structure can include a first antiferromagnetic layer adjacent to a first magnetic layer and a second magnetic layer separated from the first magnetic layer by a first non-magnetic layer to form a first synthetic antiferromagnetic structure. The first shield stabilization structure can be positioned adjacent to a portion of the first shield. The width and depth of the first stabilization structure can be greater than or equal to a width and depth of the sensor stack. The width of the first stabilization structure can be greater than the depth of the first stabilization structure.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising a sensor stack positioned on an air bearing surface (ABS) with a first width, the sensor stack separated from a shield by a stabilization structure having a second width on the ABS greater than the first width, the stabilization structure comprising first, second, third, fourth, fifth, and sixth magnetic layers and a first non-magnetic layer, the first non-magnetic layer contacting first and second laminations having balanced magnetic moments, the first lamination comprising the first, second, third, and fourth magnetic layers with the second layer disposed between the first and third magnetic layers, the first, third, and fifth magnetic layers each comprising a first material and the second magnetic layer comprising a first alloy of the first material, the second lamination comprising the fifth and sixth magnetic layers, the sixth magnetic layer comprising a second alloy of the first material.

2. The apparatus of claim 1, wherein the first, second, and third magnetic layers each continuously extend for the second width on the ABS.

3. The apparatus of claim 1, wherein first and second side shields respectively have third and fourth widths on the ABS.

4. The apparatus of claim 3, wherein the second width comprises the first, third, and fourth widths.

5. The apparatus of claim 1, wherein a second non-magnetic layer contacts the stabilization structure and sensor stack.

6. The apparatus of claim 5, wherein the second non-magnetic layer has the second width.

7. The apparatus of claim 5, wherein the second non-magnetic layer contacts first and second side shields positioned on opposite lateral sides of the sensor stack on the ABS.

8. The apparatus of claim 1, wherein the first, second, and fourth magnetic layers are different materials.

9. The apparatus of claim 1, wherein the first magnetic layer comprises CoFe.

10. The apparatus of claim 1, wherein the fourth magnetic layer comprises an antiferromagnetic material.

11. The apparatus of claim 1, wherein the second magnetic layer comprises an CoFe alloy.

12. A magnetic element comprising:
a sensor stack positioned on an air bearing surface (ABS) with a first width;
a first stabilization structure separating the sensor stack from a first shield on the ABS, the stabilization structure comprising first, second, third, fourth, fifth, and sixth magnetic layers and a first non-magnetic layer, the first non-magnetic layer contacting first and second laminations having balanced magnetic moments, the first lamination comprising the first, second, third, and fourth magnetic layers with the second layer disposed between the first and third magnetic layers, the first, third, and fifth magnetic layers each comprising a first material and the second magnetic layer comprising a first alloy of the first material, the second lamination comprising the fifth and sixth magnetic layers, the sixth magnetic layer comprising a second alloy of the first material; and
a second stabilization structure separating the sensor stack from a second shield on the ABS, the first and second stabilization structures each having a second width on the ABS greater than the first width.

13. The magnetic element of claim 12, wherein the sensor stack comprises a tunneling magneto-resistance lamination with a pinned magnetic layer and a free magnetic layer.

14. The magnetic element of claim 13, wherein the first stabilization structure is positioned proximal the free magnetic layer and distal the pinned magnetic layer, the first stabilization structure separated from the sensor stack by a second non-magnetic layer having the second width.

15. The magnetic element of claim 13, wherein the second stabilization structure is positioned proximal the pinned magnetic layer and distal the free magnetic layer, the second stabilization structure contacting the sensor stack.

16. The magnetic element of claim 12, wherein the second stabilization structure comprises seventh, eighth, ninth, and tenth magnetic layers each having the second width, the seventh magnetic layer contacting the sensor stack, the eighth and ninth magnetic layers separated by a second non-magnetic layer.

17. The magnetic element of claim 16, wherein the eighth and ninth magnetic layers comprise the first material, the seventh magnetic layer constructed of a material chosen from the group of: CoFeX alloy, or NiFeX alloy.

18. The magnetic element of claim 12, wherein an intervening layer continuously extends to separate the second stabilization structure from a side shield and the side shield from the sensor stack.

19. A data sensor comprising:
a sensor stack positioned on an air bearing surface (ABS) with a first width; and
a stabilization structure separating the sensor stack from a shield on the ABS, the stabilization structure and shield each having a second width on the ABS greater than the first width, the stabilization structure comprising first, second, third, fourth, fifth, and sixth magnetic layers and a first non-magnetic layer, the first non-magnetic layer contacting first and second laminations having balanced magnetic moments to bias the stabilization structure and shield, the first lamination comprising the first, second, third, and fourth magnetic layers with the second layer disposed between the first and third magnetic layers, the first, third, and fifth magnetic layers each comprising CoFe material and the second magnetic layer comprising a CoFeX alloy, the second lamination comprising the fifth and sixth magnetic layers, the sixth magnetic layer constructed of a material chosen from the group of: CoFeX alloy, or NiFeX alloy.

20. The data sensor of claim 19, wherein the first, second, and third magnetic layers have different thicknesses to produce antiferromagnetic biasing through exchange coupling.

\* \* \* \* \*